United States Patent
Wang et al.

(10) Patent No.: US 10,982,315 B2
(45) Date of Patent: Apr. 20, 2021

(54) MASK PLATE FOR EVAPORATION

(71) Applicant: BOE TECHNOLOGY GROUP CO., LTD., Beijing (CN)

(72) Inventors: Youwei Wang, Beijing (CN); Song Zhang, Beijing (CN); Tao Sun, Beijing (CN); Ping Song, Beijing (CN); Peng Cai, Beijing (CN); Yuanzheng Guo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 94 days.

(21) Appl. No.: 15/840,301

(22) Filed: Dec. 13, 2017

(65) Prior Publication Data

US 2018/0355468 A1 Dec. 13, 2018

(30) Foreign Application Priority Data

Jun. 8, 2017 (CN) .......................... 201710428142.1

(51) Int. Cl.
| | | |
|---|---|---|
| *C23C 14/04* | (2006.01) | |
| *H01L 51/00* | (2006.01) | |
| *H01L 51/56* | (2006.01) | |
| *C23C 14/12* | (2006.01) | |

(52) U.S. Cl.
CPC ............ *C23C 14/042* (2013.01); *C23C 14/12* (2013.01); *H01L 51/001* (2013.01); *H01L 51/56* (2013.01); *H01L 51/0011* (2013.01)

(58) Field of Classification Search
None
See application file for complete search history.

(56) References Cited

U.S. PATENT DOCUMENTS

| | | | | |
|---|---|---|---|---|
| 6,890,385 | B2 * | 5/2005 | Tsuchiya | C23C 14/042 118/504 |
| 8,673,077 | B2 * | 3/2014 | Sonoda | C23C 14/042 118/716 |
| 2005/0019968 | A1 * | 1/2005 | Kuwahara | C23C 14/042 438/26 |
| 2005/0034810 | A1 * | 2/2005 | Yamazaki | G03F 7/70741 156/345.3 |

(Continued)

FOREIGN PATENT DOCUMENTS

| | | |
|---|---|---|
| CN | 102082163 A | 6/2011 |
| CN | 103938154 A | 7/2014 |
| CN | 104157550 A | 11/2014 |

(Continued)

OTHER PUBLICATIONS

Machine Generated English Translation of the claims of CN106119773. Published Nov. 16, 2016 (Year: 2016).*

(Continued)

*Primary Examiner* — Sylvia MacArthur
(74) *Attorney, Agent, or Firm* — Dilworth & Barrese, LLP.; Michael J. Musella, Esq.

(57) ABSTRACT

A mask plate, a manufacturing method of the mask plate, and a method of evaporation by using the mask plate are provided. The mask plate includes an opening plate, the opening plate includes an opening and a blocking portion outside the opening, a concavity is in the blocking portion, and a depth of the concavity is smaller than a thickness of the blocking portion.

14 Claims, 2 Drawing Sheets

(56) References Cited

U.S. PATENT DOCUMENTS

2014/0374381 A1 12/2014 Ye
2017/0028692 A1* 2/2017 Kim .................... B32B 37/0046

FOREIGN PATENT DOCUMENTS

CN 106119773 A 11/2016
CN 106444274 A 2/2017
CN 106567052 A 4/2017

OTHER PUBLICATIONS

Machine Generated English Translation of the description of CN 106119773. Published Nov. 16, 2016 (Year: 2016).*
Machine Generated English Translation of the abstract of CN106119773. Published Nov. 16, 2016 (Year: 2016).*
First Chinese Office Action dated Nov. 29, 2018.

* cited by examiner

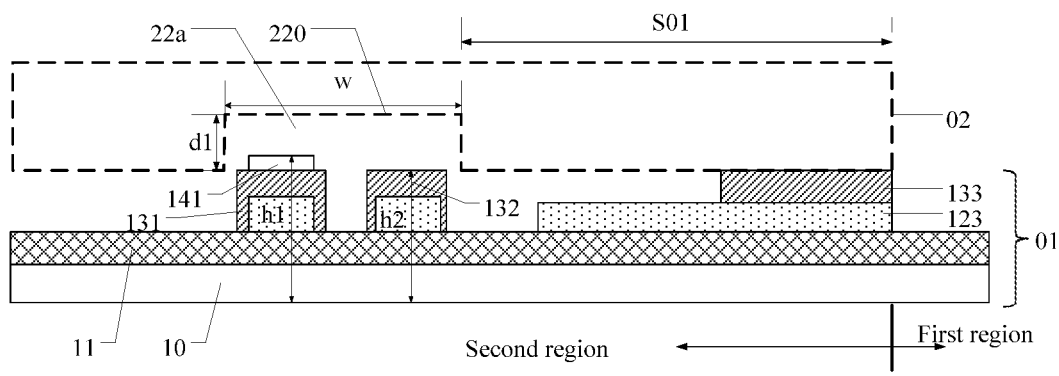

Fig. 3

Aligning the mask plate with a substrate to be evaporated and attaching the mask plate to the substrate to be evaporated, wherein the substrate to be evaporated includes a first region and a second region outside the first region, the first region corresponds to the opening of the mask plate, and a gap is formed between the second region and a concave surface of the concavity of the mask plate Evaporating an evaporation material so that the evaporation material passes through the opening and is deposited in the first region corresponding to the opening of the substrate to be evaporated

Fig. 4

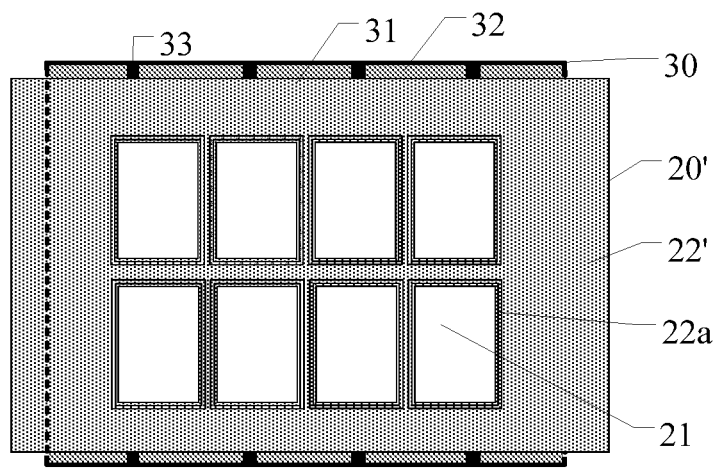

MASK PLATE FOR EVAPORATION

TECHNICAL FIELD

Embodiments of the present disclosure relate to a mask plate, a manufacturing method of the mask plate, and a method of evaporation by using the mask plate.

BACKGROUND

Mask plates are used to make desired patterns, and the mask plates are widely used in the pattern making process of transistors, liquid crystal display panels, OLED (organic light-emitting diode) panels and other electronic products. An evaporation process is a commonly-used technology in the process of making patterns. For example, in the evaporation process, a material is heated to a gaseous state, and the material is formed on a substrate after the material passes through a mask plate, so that a desired pattern is obtained.

SUMMARY

Embodiment of the present disclosure provide a mask plate, a manufacturing method of a mask plate, and a method of evaporation by using the mask plate, and the mask plate prevents particles from forming at a relatively high protrusion of a substrate to be evaporated.

At least one embodiment of the present disclosure provides a mask plate, the mask plate includes an opening plate, the opening plate includes an opening and a blocking portion outside the opening, a concavity is in the blocking portion, and a depth of the concavity is smaller than a thickness of the blocking portion.

For example, the concavity is a closed annular concavity.

For example, the blocking portion is provided with a concave alignment mark, and the concavity is different from the alignment mark.

For example, a distance between the concavity and the opening is greater than or equal to 100 microns.

For example, a width of the concavity is greater than 40 microns.

For example, the depth of the concavity is greater than 3.5 microns and smaller than 100 microns.

For example, the blocking portion includes a first surface and a second surface which are opposite to each other, the opening passes through both the first surface and the second surface, a concave surface of the concavity is opposite to the second surface, and a portion of the first surface between the opening and the concavity is planar.

For example, the opening plate includes a plurality of the openings and a plurality of the concavities, the plurality of the concavities are in the blocking portion, and the plurality of the concavities and the plurality of the openings correspond to each other in a one-to-one manner.

For example, a distance between adjacent ones of the openings is greater than 200 microns.

For example, the mask plate further includes a frame, the frame includes a hollow portion and a frame body surrounding the hollow portion, both the opening and the concavity of the opening mask correspond to the hollow portion, and the blocking portion of the opening mask is connected with the frame body.

At least one embodiment of the present disclosure further provides a manufacturing method of a mask plate, and the method includes forming an opening plate, the opening plate includes an opening and a blocking portion outside the opening, a concavity is in the blocking portion, and a depth of the concavity is smaller than a thickness of the blocking portion.

For example, the concavity is formed by an etching method.

For example, an initial opening plate for forming the opening plate is mounted on a frame; the initial opening plate includes the opening and an initial blocking portion outside the opening, the initial blocking portion is configured to form the blocking portion, and the concavity is in the initial blocking portion; the frame includes a hollow portion and a frame body surrounding the hollow portion, the opening of the initial opening plate corresponds to the hollow portion, and the initial blocking portion of the initial opening plate is connected with the frame body; and at least a portion of an edge of the initial blocking portion is removed.

At least one embodiment of the present disclosure further provides a method of evaporation by using the mask plate described in any one of the above embodiments, and the method includes: aligning the mask plate with a substrate to be evaporated and attaching the mask plate to the substrate to be evaporated, in which the substrate to be evaporated includes a first region and a second region outside the first region, the first region corresponds to the opening of the mask plate, and a gap is formed between the second region and a concave surface of the concavity of the mask plate; and evaporating an evaporation material so that the evaporation material passes through the opening and is deposited in the first region of the substrate to be evaporated.

For example, the substrate to be evaporated includes a first protrusion in the second region; in the second region, the substrate to be evaporated has a first thickness in the first protrusion and has a second thickness outside the first protrusion, and the first thickness is greater than the second thickness; and a gap is formed between the concave surface of the concavity and the first protrusion.

For example, a second protrusion is in the second region, and the second protrusion is between the first protrusion and the first region; and under a condition that the mask plate is attached to the substrate to be evaporated, a gap is formed between the concave surface of the concavity and the second protrusion.

BRIEF DESCRIPTION OF THE DRAWINGS

In order to clearly illustrate the technical solution of the embodiments of the disclosure, the drawings of the embodiments will be briefly described in the following, it is obvious that the described drawings are only related to some embodiments of the disclosure and thus are not limitative of the disclosure.

FIG. 3 is a schematic view illustrating a contact mode between the mask plate and a substrate to be evaporated provided by the embodiments of the present disclosure;

FIG. 4 is a flow chart of an evaporation method provided by the embodiments of the present disclosure; and FIG. 5 is a schematic view of an initial opening plate and a frame in the manufacturing method of the mask plate provided by the embodiments of the present disclosure.

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, the technical terms or scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "Over," "under," "right," "left" and the like are only used to indicate relative position relationship, and when the position of the object which is described is changed, the relative position relationship may be changed accordingly.

An organic light-emitting diode (OLED) display device has advantages of self-luminescence, high brightness, high contrast, low working voltage, and capability of being used for making a flexible display and so on, and thus is considered as the most promising display device.

Figure 1:
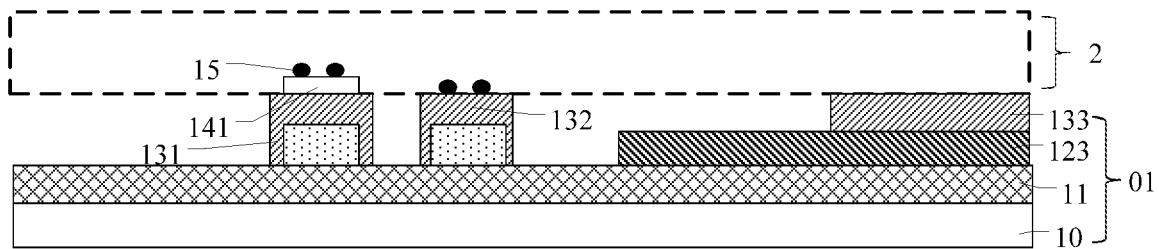
FIG. 1 is a schematic view illustrating a contact mode between a mask plate and a substrate which is used to form an OLED array substrate.

An organic light-emitting functional layer of an OLED array substrate included in the OLED display device is usually deposited in an evaporation method. Taking an OLED array substrate of a flexible OLED display device as an example, a mask plate is in contact with a substrate to be evaporated closely in an evaporation process of an organic light-emitting functional layer of the OLED array substrate of the flexible OLED display device. For example, a contact mode of the mask plate 2 and the frame region of the substrate to be evaporated 01 is illustrated in FIG. 1, in which the dotted line represents the mask plate 2, the substrate to be evaporated 01 includes a base substrate 10, and an insulating layer 11, a planarization layer 123, a pixel definition layer 133, a first dam 131, a second dam 132 which are on the base substrate 10, and a spacer 141 on the first dam 131. In a subsequent manufacturing process, a plurality of encapsulation films for blocking water and oxygen are further formed on the substrate to be evaporated 01, the plurality of encapsulation films include inorganic films and organic films which are alternately arranged, and the encapsulation films are hermetically connected with the substrate to be evaporated 01 at positions of the first dam 131 and the second dam 132.

In research, the inventors of the present disclosure notice that the substrate to be evaporated 01 has a greater height at the position of the first dam 131 than the heights at the other positions; and in the evaporation process, the mask plate 2 directly contacts with the substrate to be evaporated 01, and the relative movement between the mask plate 2 and the substrate to be evaporated 01 is carried out for aligning, which results in the formation of particles 15 at the spacer 141 on the first dam 131, or the formation of particles 15 at both the spacer 141 and the second dam 132. In a subsequent encapsulation process, if an inorganic encapsulation film directly contacts with the substrate to be evaporated 01 at the place where the particles 15 are generated, the particles 15 may lead to the cracking of the inorganic encapsulated film, and further lead to the failure of the encapsulation of the fabricated OELD display device in the frame region.

Figure 2A:
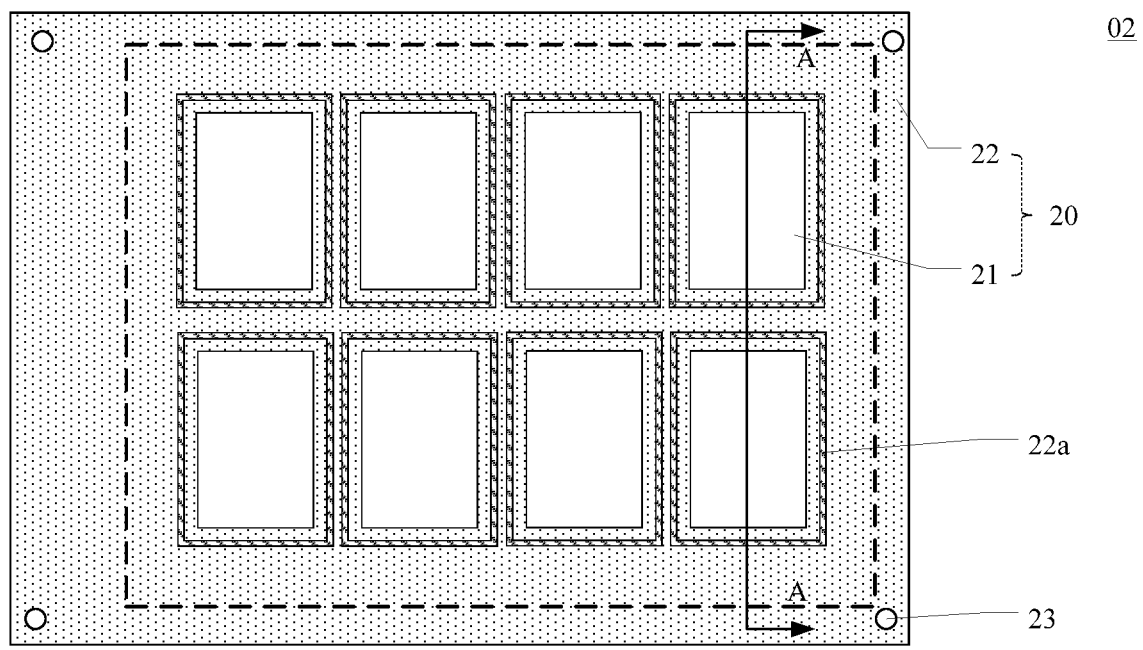
FIG. 2*a* is a schematic top view of a mask plate provided by embodiments of the present disclosure.
Figure 2B:
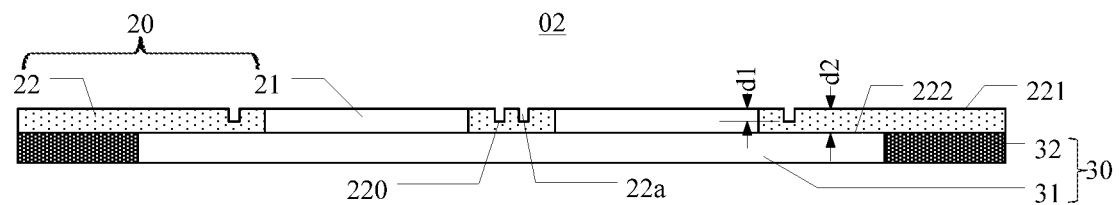
FIG. 2*b* is a schematic sectional view taken along a line AA in FIG. 2*a*.

For example, as illustrated in FIG. 2a and FIG. 2b, at least one embodiment of the present disclosure provides a mask plate 02, and the mask plate 02 includes an opening plate 20, and the opening plate 20 includes an opening 21 passing through the opening plate 20 and a blocking portion 22 outside the opening 21. For example, the mask plate 02 is an evaporation mask plate for evaporating, and the opening 21 is configured for enabling an evaporation material to pass through the mask plate 02 so as to be deposited on the substrate during an evaporation process, and the blocking portion 22 is configured for blocking the evaporation material in the evaporation process. A concavity 22a is in the blocking portion 22 of the opening plate 20, and a depth d1 of the concavity 22a is smaller than a thickness d2 of the blocking portion 22 (referring to FIG. 2b). That is to say, the concavity 22a does not pass through the blocking portion 22. The blocking portion 22 is nonopaque for light or opaque at the concavity 22a, as long as the concavity 22a blocks the evaporation material. For example, the blocking portion 22 is totally opaque at the concavity 22a, so as to prevent light from passing through the concavity 22a, being incident to the substrate to be evaporated 01 and making adverse effects on the substrate to be evaporated 01.

In the embodiments of the present disclosure, the concavity is formed in the mask plate at a place corresponding to a dam of the substrate to be evaporated, so that a gap is formed between the concavity of the mask plate and the dam of the substrate to be evaporated during the evaporation process, and thus the phenomenon that particles are formed at the dam of the substrate to be evaporated is avoided, and further the encapsulation stability of the frame region of, for example, the OLED array substrate and the life of, for example, the flexible OLED display device are improved.

For example, the mask plate 02 is configured to make an organic light-emitting functional layer or an electrode of the OLED array substrate, and may also be configured to make other array substrates having a similar structure. The following embodiments of the present disclosure illustrate by taking the mask plate used in the evaporation process of an organic light-emitting functional layer of the OLED array substrate as an example.

For example, the substrate to be evaporated is an OLED array substrate master, and the master includes a plurality of regions to be evaporated which are separated from each other. After the master is manufactured, a plurality of OLED array substrates are obtained by cutting the master, each of the regions to be evaporated corresponds to an entire display region (also called AA region) of one OLED array substrate. Accordingly, as illustrated in FIG. 2a, the opening plate 20 of the mask plate 02 includes a plurality of the openings 21; in the evaporation process, each opening 21 corresponds to one of the regions to be evaporated of the substrate to be evaporated; and under this condition, a plurality of the concavities 22a are arranged in the blocking portion 22, and the plurality of the concavities 22a and the plurality of the openings 21 correspond to each other in a one-to-one manner.

The dam in the OLED array substrate are usually in a closed ring structure, so in a case that the mask plate provided by the present embodiments of the present disclosure is used in the evaporation process of the organic light-emitting function layer of the OLED array substrate or the like, the concavity 22a is a closed annular concavity, as illustrated in FIG. 2a, so that the shape of the concavity 22a match with the shape of the dam.

In the evaporation process, the mask plate needs to be aligned with the substrate to be evaporated. Therefore, the mask plate is usually provided with alignment marks. For example, as illustrated in FIG. 2a, the blocking portion 22 of the mask plate 02 is provided with concave alignment marks 23, and the concavities 22a are different from the alignment marks 23. For example, the concavities 22a are arranged at different places from the alignment marks 23: the alignment marks 23 are respectively arranged at top corners of the mask plate 02 or are respectively close to outer edges of the mask plate 02, and the concavities 22a are respectively close to the openings 21 of the opening plate 20. For example, the alignment marks 23 differ from the concavities 22a in shape: the alignment marks 23 may be in any shapes, and the concavities 22a are in annular structures around the openings 21, respectively. For example, the plurality of the concavities 22a and the plurality of the openings 21 correspond to each other in a one-to-one manner, and it is not necessary for each opening 21 to correspond to one or more alignment mark 23.

For example, as illustrated in FIG. 2b, the blocking portion 22 includes a first surface 221 and a second surface 222 which are opposite to each other, the opening 21 passes through both the first surface 221 and the second surface 222. For example, the concavity 22a is obtained by etching the material layer for forming the blocking portion 22. In such a situation, for example, a concave surface 220 of the concavity 22 is opposite to the second surface 222, and an entire portion, between the opening 21 and the concavity 22a, of the first surface 221 is planar; and for example, between the adjacent openings 21, an entire portion of the first surface 221 between the adjacent concavities 22a is planar.

For example, as illustrated in FIG. 2b, the mask plate 02 further includes a frame 30, the frame 30 includes a hollow portion 31 and a frame body 32 surrounding the hollow portion 31, both the opening 21 and the concavity 22a correspond to the hollow portion 31, and the blocking portion 22 is connected with the frame body 32, for example, the blocking portion 22 is connected with the frame body 32 in a welded connection mode. For example, a plurality of etched concavities (the etched concavities are not illustrated in FIG. 2b) are further provided in the frame body 32 of the frame 30, support rods are respectively arranged in the plurality of the etched concavities to support the opening plate 20.

FIG. 3 is a schematic view of a contact mode between the mask plate and the substrate to be evaporated in the evaporation process provided by the embodiments of the present disclosure. As illustrated in FIG. 3, the substrate to be evaporated 01 includes a first region and a second region outside the first region; and in a situation that the substrate to be evaporated 01 is an array substrate, the first region corresponds to the whole display region of the array substrate, and the second region corresponds to the frame region of the array substrate. For example, in the substrate to be evaporated 01, the second dam 132 is arranged between the first dam 131 and the first region, and a distance between an inner edge (that is the edge close to the first region) of the second dam 132 and the first region is from 100 microns ($\mu m$) to 130 microns; a width of the second dam 132 is from 40 microns to 50 microns and a height of the second dam 132 h2 is from 3.5 microns to 4.0 microns; a distance between the first dam 131 and second dam 132 is from 40 microns to 50 microns; and a width of the first dam 131 is from 40 microns to 50 microns, and a total height h1 of the first dam 131 and the spacer 141 arranged on the first dam 131 is from 4 microns to 4.5 microns.

Taking the above sizes of the structures in the substrate to be evaporated into account, correspondingly, in the case that the concavity 22a of the mask plate 02 corresponds to the first dam 131, for example, a distance S01 from the concavity 22a to its adjacent opening (not marked in FIG. 3) is greater than or equal to 100 microns, for example, greater than or equal to 180 microns. In the case that the concavity 22a of the mask plate 02 corresponds to the second dam 132, for example, the distance S01 from the concavity 22a to its adjacent opening is greater than or equal to 100 microns.

The distance from the second dam 132 of the substrate to be evaporated to the first region is greater than or equal to 100 microns, the distance from the first dam 131 to the first region is greater than or equal to 180 microns. Therefore, the distance between the adjacent regions to be evaporated for forming the adjacent display regions of the substrate to be evaporated is greater than 200 microns (for example, greater than 360 microns). Accordingly, the distance between the adjacent openings of the mask plate 02 is greater than 200 microns (for example, greater than 360 microns).

The width of the first dam 131, the width of the second dam 132 and the distance between the first dam 131 and the second dam 132 are from 40 microns to 50 microns respectively. Therefore, for example, in a case that the concavity 22a corresponds to one of the first dam 131 and the second dam 132, the width w of the concavity 22a is greater than 40 microns, for example, greater than 50 microns; for example, in a case that the concavity 22a corresponds to both the first dam 131 and the second dam 132, the width of the concavity 22a is greater than 150 microns.

The total height h1 of the first dam 131 and the spacer 141 arranged on the first dam 131 is from 4 microns to 4.5 microns, so in a case that the concavity 22a corresponds to the first dam 131, for example, the depth d1 of the concavity 22a is greater than 4 microns, for example, greater than 4.5 microns; and the height of the second dam 132 is from 3.5 microns to 4.0 microns, so in a case that the concavity 22a corresponds to the second dam 132, for example, the depth d1 of the concavity 22a is greater than 3.5 microns, for example, greater than 4.0 microns. With comprehensive consideration, for example, the depth d1 of the concavity 22a is greater than 3.5 microns, for example, greater than 4.5 microns. On this basis, the depth of the concavity 22a is smaller than 100 microns due to the thickness of the blocking portion 22 of the mask plate 02 being usually 100 microns.

For example, the blocking portion 22 of the opening plate 20 is provided with two concavities 22a which respectively correspond to the first dam 131 and the second dam 132. For example, the blocking portion 22 of the opening plate 20 is provided with more concavities 22a to respectively correspond to protrusions at corresponding positions of the substrate to be evaporated 01.

At least one embodiment of the present disclosure further provides a method of evaporation by using the mask plate 02 described in any one of the above embodiments. As illustrated in FIG. 3 and FIG. 4, the method includes: aligning the mask plate 02 with the substrate to be evaporated 01 and attaching the mask plate 02 to the substrate to be evaporated 01, in which, the substrate to be evaporated 01 includes a first region and a second region outside the first region, the first region corresponds to the opening of the mask plate 02, and a gap is formed between the second region and the concave surface 220 of the concavity 22a of the mask plate 02; and enabling the evaporation material to pass through the opening of the mask plate and to be deposited in the first region of the substrate to be evaporated 01. In a situation that the substrate to be evaporated 01 is made into an array substrate, the first region of the substrate to be evaporated 01 is the display region of the array substrate, and the second region of the substrate to be evaporated 01 is the frame region of the array substrate.

The evaporation method provided by the embodiments of the present disclosure may be used to evaporate the organic light-emitting functional layer of the OLED array substrate, for example, an electron injection layer, an electron transport layer, a light emitting layer, a hole transport layer, or a hole injection layer, and the evaporation method may also be used to make other structures of the OLED array substrate. The evaporation method provided by the embodiments of the present disclosure may also be used to produce substrates of other types.

For example, the substrate to be evaporated 01 includes a first protrusion arranged in the second region; in the second region, the substrate to be evaporated 01 has a first thickness at the first protrusion and has a second thickness outside the first protrusion, and the first thickness is greater than the second thickness; and a gap is formed between the concave surface 220 of the concavity 22a and the first protrusion. That is to say, the concavity 22a of the mask plate 02 corresponds to a position where the second region of the substrate to be evaporated 01 is relatively thick (for example, a relatively high position), so as to avoid the contact between the mask plate 02 and the substrate to be evaporated 01 at such position.

For example, in the second region, the substrate to be evaporated 01 has a thickness at the first protrusion greater than the thickness at all the positions outside the first protrusion, that is to say, in the second region, the first protrusion is the highest. In this situation, by forming the concavity in the mask plate 02 corresponding to the first protrusion, the phenomenon that particles are generated at the first protrusion in a case that the mask plate 02 and the substrate to be evaporated 01 are moved relative to each other is avoid.

For example, the second region is further provided with the second protrusion (for example, the second dam 132), and the second protrusion is arranged between the first protrusion and the first region; in the second region, the thickness of the substrate to be evaporated 01 at the second protrusion is smaller than the thickness of the substrate to be evaporated 01 at the first protrusion; and under the condition that the mask plate 02 is attached to the substrate to be evaporated 01, a gap is formed between the concave surface 220 of the concavity 22a and the second protrusion. Therefore, the phenomenon that particles are generated at the second protrusion in a case that the mask plate 02 and the substrate to be evaporated 01 are moved relative to each other is avoided.

For example, as illustrated in FIG. 3, in the second region, the substrate to be evaporated 01 has a first thickness (referring to h1) at the first protrusion (for example, the combination of the first dam 131 and the spacer 141) and has a second thickness (referring to h2) outside the first protrusion, for example at the second protrusion (for example, the second dam 132), and h1 is greater than h2. For example, in the second region, the second thickness (for example, h2) is greater than or equal to the thickness of the substrate to be evaporated 01 at all the positions except the first protrusion and the second protrusion. For example, the concavity 22a in the mask plate 02 corresponds to both the first protrusion and the second protrusion, and a gap is formed between the concavity 22a in the mask plate 02 and each of the first protrusion and the second protrusion during the evaporation process, so as to avoid the particles generating at the first protrusion and the second protrusion, with reference to FIG. 3; or the concavity 22a in the mask plate 02 corresponds to one of the first protrusion and the second protrusion, and a gap is formed between the concavity 22a in the mask plate 02 and the corresponding protrusion.

It should be noted that, the embodiments of the present disclosure give the descriptions by taking the first protrusion being the combination of the first dam and the spacer and the second protrusion being the second dam as an example, however, the first protrusion and the second protrusion may be other protrusion structures, which are relative high and may contact with the mask plate, of the substrate to be evaporated 01.

At least one embodiment of the present disclosure further provides a manufacturing method of a mask plate, for example, the mask plate is illustrated in FIG. 2a and FIG. 2b, and the method includes: forming an opening plate 20, so that the opening plate 20 includes an opening 21 and a blocking portion 22 outside the opening 21, a concavity 22a is in the blocking portion 22, and a depth of the concavity 22a is smaller than a thickness of the blocking portion 22.

For example, the concavity 22a is formed by etching, that is to say, the concavity 22a is formed by etching (for example, half etching) a plate configured for forming the blocking portion 22, so that the depth of the concavity 22a is smaller than the thickness of the blocking portion 22. Etching is a process in the semiconductor industry, and it is a method to remove a material by a solution manner, a reactive ion manner or other mechanical manners.

For example, as illustrated in FIG. 5, the method for manufacturing the mask plate provided by at least one embodiment of the present disclosure includes: mounting an initial opening plate 20' for forming the opening plate on the frame 30, in which the initial opening plate 20' includes the opening 21 and an initial blocking portion 22' outside the opening 21, the initial blocking portion 22' is configured to form the blocking portion, the initial blocking portion 22' is provided with the concavity 22a, and the frame 30 includes a hollow portion 31 and a frame body 32 surrounding the hollow portion 31, the opening 21 of the initial opening plate 20' corresponds to the hollow portion 31, and the initial blocking portion 22' of the initial opening plate 20' is connected with the frame body 32, for example, by welded connection; and removing at least a portion of an edge of the initial blocking portion 22' to obtain the opening plate 20 as illustrated in FIG. 2a and FIG. 2b, for example, at least a portion of the edge of the initial blocking portion 22' outside the frame is removed, so that the opening plate is obtained.

For example, the frame 30 further includes etched concavities 33 configured for respectively mounting support rods for supporting the opening plate.

For example, the manufacturing method of the mask plate provided by at least one embodiment of the present disclosure, before mounting the initial opening plate 20' on the frame 30, further includes: mounting the frame 30 on a manufacturing equipment of the mask plate.

As described above, in the embodiments of the present disclosure, the opening plate of the mask plate includes the opening and the blocking portion outside the opening, the concavity is in the blocking portion, and the depth of the concavity is smaller than the thickness of the blocking portion. Therefore, a gap is formed between the concavity of the mask plate and a protrusion of the substrate to be evaporated during the evaporation process, and thus the phenomenon that particles formed at the protrusion of the substrate to be evaporated is avoided.

The following points need to be explained: (1) the drawings of the embodiments of the present disclosure are only related to the structures mentioned in the embodiments of the present disclosure, and other structures can refer to general designs; (2) for clarity, in the drawings for describing the embodiments of the present disclosure, thicknesses of layers or sizes of regions are not drawn according to an actual scale but are exaggerated; and (3) in the case of no conflict, the embodiments of the present disclosure and the features in the embodiments can be combined with each other.

What are described above is related to the illustrative embodiments of the disclosure only and not limitative to the scope of the disclosure. Therefore, the scopes of the disclosure are defined by the accompanying claims.

The application claims priority of Chinese Patent Application No. 201710428142.1, filed on Jun. 8, 2017, the disclosure of which is incorporated herein by reference in its entirety as part of the present application.

What is claimed is:

1. A mask plate, comprising an opening plate, wherein
the opening plate comprises a plurality of openings corresponding to a plurality of panels to be processed, respectively, a plurality of blocking portions outside and surrounding the plurality of openings, respectively, and a closed concavity surrounding each opening of the plurality openings formed in top of a corresponding one of the plurality of blocking portions, to allow an orthographic projection of each of the closed concavities on a plane where the plurality of openings are located not to overlap with an orthographic projection of a corresponding opening of the plurality openings on the plane; and
a depth of the closed concavity in each of the plurality of blocking portions does not penetrate through a total thickness of the each of the plurality of blocking portions.

2. A mask plate, comprising an opening plate, wherein
the opening plate comprises a plurality of openings, a plurality of blocking portions outside and surrounding the plurality of openings, respectively, and a first closed concavity surrounding each opening of the plurality openings formed in top of a corresponding one of the plurality of blocking portions, wherein a depth of the first closed concavity in each of the plurality of blocking portions does not penetrate through a total thickness of the each of the plurality of blocking portions.

3. The mask plate according to claim 2, wherein a portion of each of the plurality of blocking portions is provided between the first closed concavity and a corresponding opening to space the first closed concavity apart from the corresponding opening, and the portion of the blocking portion has a thickness same to that of a remaining portion of the blocking portion.

4. The mask plate according to claim 3, wherein each of the plurality of blocking portions comprises a first surface and a second surface which are opposite to each other, a corresponding opening passes through the first surface and the second surface, a concave surface of a corresponding first closed concavity is opposite to the second surface, and a portion of the first surface between the corresponding opening and the corresponding first closed concavity is planar.

5. The mask plate according to claim 3, further comprising a frame, wherein the frame comprises a hollow portion and a frame body surrounding the hollow portion, both the plurality of openings and the first closed concavities of the opening plate correspond to the hollow portion, and the plurality of blocking portions of the opening plate are connected with the frame body.

6. The mask plate according to claim 2, wherein each of the plurality of blocking portions is provided with a concave alignment mark, and each first closed concavity is different from and spaced apart from the concave alignment mark.

7. The mask plate according to claim 6, wherein each of the plurality of blocking portions comprises a first surface and a second surface which are opposite to each other, the opening passes through the first surface and the second surface, a concave surface of the first closed concavity is opposite to the second surface, and a portion of the first surface between each opening and the corresponding first closed concavity is planar.

8. The mask plate according to claim 2, wherein a distance between each first closed concavity and a corresponding one of the plurality of openings is greater than or equal to 100 microns.

9. The mask plate according to claim 2, wherein a width of each first closed concavity is greater than 40 microns.

10. The mask plate according to claim 2, wherein the depth of each first closed concavity is greater than 3.5 microns and smaller than 100 microns.

11. The mask plate according to claim 2, wherein each of the plurality of blocking portions comprises a first surface and a second surface which are opposite to each other, a corresponding opening passes through both the first surface and the second surface, a concave surface of each first closed concavity is opposite to the second surface, and a portion of the first surface between the corresponding opening and the corresponding first closed concavity is planar.

12. The mask plate according to claim 2, wherein a distance between adjacent ones of the plurality of openings is greater than 200 microns.

13. The mask plate according to claim 2, wherein a second closed concavity is provided in each of the plurality of blocking portions, a depth of each second closed concavity is smaller than the thickness of the each of the plurality of blocking portions, and each first closed concavity and a corresponding second closed concavity surrounds a same opening of the plurality of openings.

14. The mask plate according to claim 2, further comprising a frame, wherein the frame comprises a hollow portion and a frame body surrounding the hollow portion, both the plurality of openings and the first closed concavities of the opening plate correspond to the hollow portion, and the plurality of blocking portions of the opening plate are connected with the frame body.

* * * * *